United States Patent
Takahashi et al.

(10) Patent No.: US 7,718,519 B2
(45) Date of Patent: May 18, 2010

(54) METHOD FOR MANUFACTURING SILICON CARBIDE SEMICONDUCTOR ELEMENT

(75) Inventors: Kunimasa Takahashi, Hyogo (JP); Chiaki Kudou, Hyogo (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 12/302,372

(22) PCT Filed: Mar. 27, 2008

(86) PCT No.: PCT/JP2008/000769

§ 371 (c)(1),
(2), (4) Date: Nov. 25, 2008

(87) PCT Pub. No.: WO2008/120469

PCT Pub. Date: Oct. 9, 2008

(65) Prior Publication Data

US 2009/0186470 A1    Jul. 23, 2009

(30) Foreign Application Priority Data

Mar. 29, 2007    (JP) .............................. 2007-087346

(51) Int. Cl.
*H01L 21/265* (2006.01)
(52) U.S. Cl. ................ 438/522; 438/796; 257/E21.054
(58) Field of Classification Search ................ 438/522, 438/796; 257/E21.054
See application file for complete search history.

(56) References Cited

U.S. PATENT DOCUMENTS 5,952,679 A * 9/1999 Kitou et al. .................... 257/77

2007/0045631 A1 * 3/2007 Endo et al. .................... 257/77

FOREIGN PATENT DOCUMENTS

| JP | 2002-184712 | 6/2002 |
|---|---|---|
| JP | 2002-314071 | 10/2002 |
| JP | 2003-092267 | 3/2003 |
| JP | 2005-260267 | 9/2005 |
| JP | 2005-303010 | 10/2005 |
| JP | 3760688 | 1/2006 |
| JP | 2006-324585 | 11/2006 |

OTHER PUBLICATIONS

International Search Report for corresponding Application No. PCT/JP2008/000769 mailed May 13, 2008.
Form PCT/ISA/237 and partial English Translation.

* cited by examiner

*Primary Examiner*—Trung Dang
(74) *Attorney, Agent, or Firm*—Renner, Otto, Boisselle & Sklar, LLP (57) ABSTRACT

A method of producing a silicon carbide semiconductor device, including: step (A) of forming an impurity-doped region by implanting impurity ions 3 into at least a portion of a silicon carbide layer 2 formed on a first principal face of a silicon carbide substrate 1 having first and second principal faces; step (B) of forming capping layers 6 having thermal resistance on at least an upper face 2a of the silicon carbide layer 2 and on at least a second principal face 12a of the silicon carbide substrate 1; and step (C) of performing an activation annealing treatment by heating the silicon carbide layer 2 at a predetermined temperature.

10 Claims, 5 Drawing Sheets

METHOD FOR MANUFACTURING SILICON CARBIDE SEMICONDUCTOR ELEMENT

TECHNICAL FIELD

The present invention relates to a method of producing a semiconductor device using silicon carbide.

BACKGROUND ART

Silicon carbide (silicon carbide, SiC), which has a wider band gap and a higher dielectric breakdown field intensity than those of silicon (Si), is a semiconductor material whose applications to low-loss power devices and the like of the next generation are expected. Silicon carbide has many polytypes such as 3C—SiC having a cubic system and 6H—SiC and 4H—SiC having a hexagonal system. Among these, it is 4H—SiC that is commonly used for producing practical silicon carbide semiconductor devices. Generally speaking, substrates whose principal faces are faces substantially coinciding with the (0001) plane, which is perpendicular to a crystal axis of the c axis, are broadly used.

In order to produce a silicon carbide semiconductor device (SiC semiconductor device), it is necessary to form an epitaxially-grown layer to become an active region of the semiconductor device on a silicon carbide substrate (SiC substrate), and control the conductivity type and carrier concentration in selected regions of this layer. In order to form an impurity-doped region in a selected local region, it is indispensable to perform an ion implantation of an impurity dopant into the epitaxially-grown layer.

Hereinafter, with reference to FIGS. 6(a) to (d), a conventional method of forming an impurity-doped region will be described, by taking as an example a method of forming a p-well region of a MOSFET disclosed in Patent Document 1.

Figure 6:
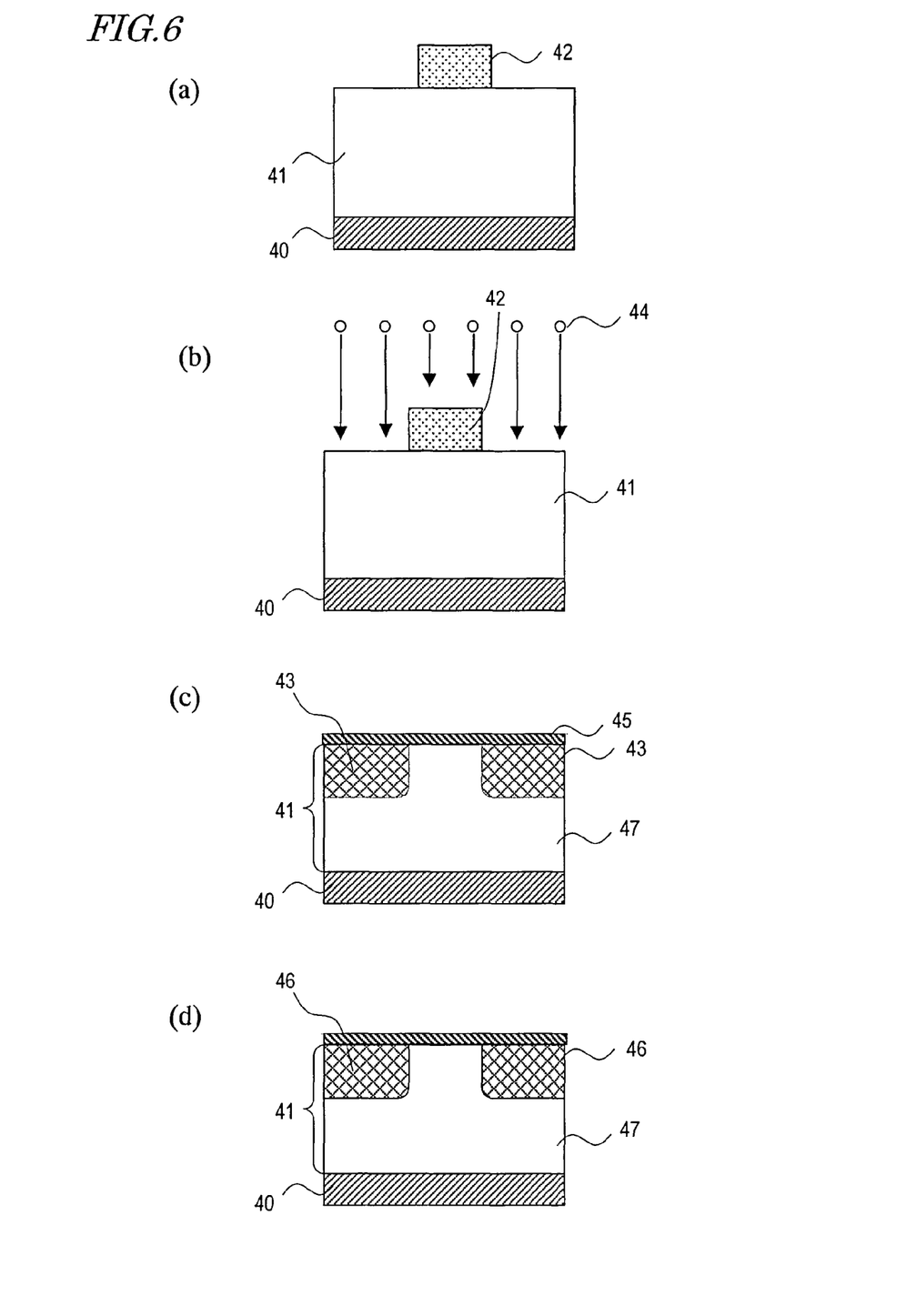

First, as shown in FIG. 6(a), a silicon carbide layer 41 functioning as an n-drift layer is formed on an SiC substrate 40. As the SiC substrate 40, an SiC substrate having a surface (step structure surface) with an increased step density, which is tilted by several degrees (OFF angle) from the (0001) plane, is used. On this surface of the SiC substrate 40, the silicon carbide layer 41 is epitaxially grown by utilizing a step flow based on lateral growth of the steps. Next, an ion implantation mask 42 is formed on a front face of the silicon carbide layer 41. The implantation mask 42 is provided in a region of the silicon carbide layer 41 other than the region where a p-well region 46 (FIG. 6(d)) is formed.

Next, as shown in FIG. 6(b), impurity ions (Al ions) 44 are implanted into the silicon carbide layer 41 from above the implantation mask 42. Thereafter, as shown in FIG. 6(c), the implantation mask 42 is removed, and a capping layer 45 composed of a diamond-like carbon film or organic film is formed only on the front face of the silicon carbide layer 41, in which an impurity ion-implanted region 43 has been formed.

Thereafter, as shown in FIG. 6(d), an activation annealing treatment is performed to effect recovery from the damage caused in the crystal due to ion implantation and activation of the impurity ions. The activation annealing treatment is performed by heating the silicon carbide substrate 40 to a temperature of 1700° C. or above. Through the activation annealing treatment, the p-well region 46 is formed in a portion of the silicon carbide layer 41 as an impurity-doped region. The region of the silicon carbide layer 41 where the p-well region 46 is not formed defines an n-drift region 47.

[Patent Document 1] Japanese Patent No. 3760688

DISCLOSURE OF INVENTION

Problems to be Solved by the Invention

Conventionally, silicon carbide semiconductor devices have been produced by using cut substrates which are on the order of several centimeters square. This is because it has been difficult to obtain large silicon carbide single crystals and because silicon carbide semiconductor devices have still been at the research and development level.

However, in recent years, techniques have been established for producing large silicon carbide single crystals, which makes available silicon carbide wafers that are 2 inches or larger. Moreover, development of silicon carbide semiconductor devices has also progressed, reaching a stage where commercial products could be prototyped or manufactured. Therefore, there is a challenge of developing a technique for producing silicon carbide semiconductor devices by using silicon carbide substrates which are sized 2 inches or larger.

By using conventional manufacturing techniques, the inventors have produced silicon carbide semiconductor devices on silicon carbide wafers which are 2 inches or larger, thus finding a problem in that a silicon carbide wafer may be greatly warped after the aforementioned impurity-doped region is formed. If the silicon carbide wafer is warped, it becomes difficult to form an accurate pattern in a lithography step, and it also becomes difficult to properly handle the silicon carbide wafer in various semiconductor fabrication apparatuses. As a result, it becomes altogether impossible to perform the various fabrication processes for producing a silicon carbide semiconductor device.

In the case of a silicon wafer or a gallium arsenic wafer, even if the wafer is warped, the wafer can be held by forcibly planarizing the warped wafer by vacuum chucking. Therefore, conventionally, there has not been much problem even when some warp is present in a silicon wafer or gallium arsenic wafer.

Figure 7:
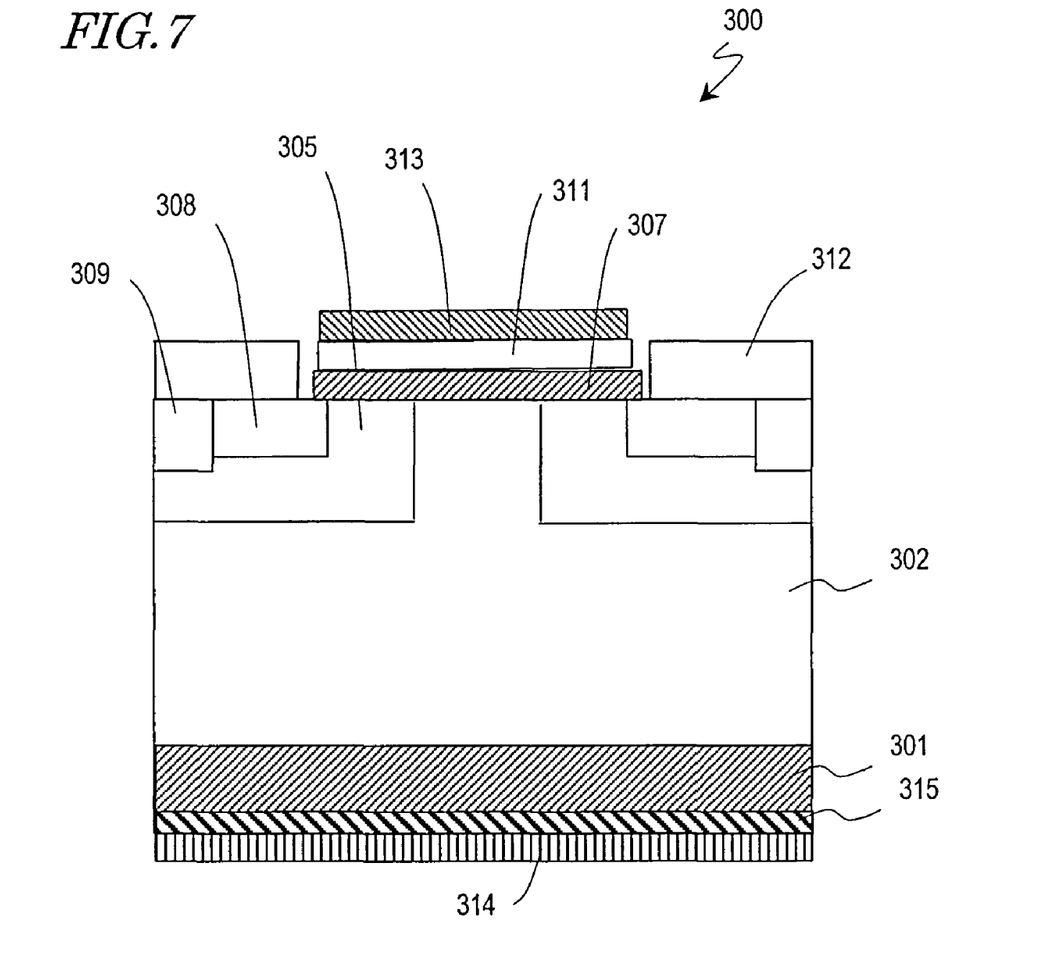
[FIG. 7] A schematic cross-sectional view showing a semiconductor device according to a conventional technique.

However, a silicon carbide has a very high hardness. Therefore, warping of a silicon carbide wafer cannot be alleviated with vacuum chucking, and it is very difficult to forcibly planarize and hold the warped silicon carbide wafer. Moreover, depending on the strength of vacuum chucking, the silicon carbide wafer may possibly be cracked. Thus, a warp occurring in silicon carbide wafers presents a problem that is not associated with conventional silicon wafers or gallium arsenic wafers. Moreover, according to the conventional techniques, a capping layer is formed only on the implantation plane and activation annealing is performed, so that silicon is selectively sublimated from the rear face of the silicon carbide substrate. As a result, the rear face of the substrate acquires a composition with an excess of carbon (carbon-rich). FIG. 7 shows the structure of a vertical power MOSFET 300 which is formed by a conventional technique. The power MOSFET 300 includes a silicon carbide substrate 301 and a drift layer 302 which is formed on the silicon carbide substrate 301. A well region 305 is formed in the drift layer 302, and a source region 308 is formed in the well region 305. Furthermore, within the source region 308, a contact region 309 that reaches the well region 305 is provided. A accumulation channel layer 307 is formed so as to be in contact with the source region 308, the well region 305, and the drift layer 302, and a gate electrode 313 is provided above the accumulation channel layer 307, via a gate insulating film 311. A source electrode 312 is provided so as to be in contact with the source region 308 and the contact region 309.

As described above, during the activation annealing, a carbon excessive layer 315 occurs on the rear face of the silicon carbide substrate 301, which is not covered with a capping layer. Since the carbon excessive layer 315 has a high resistance, there is also a problem in that the ohmic contact characteristics of the drain electrode 314 on the rear face with respect to the silicon carbide substrate 301 are deteriorated, thus resulting in a resistance component.

There is also a problem in that, the sublimated silicon which is deposited on the inner walls of the annealing apparatus may hinder stable operation over a long time.

An objective of the present invention is to solve such problems of the conventional technique, and provide a method of producing a silicon carbide semiconductor device without allowing the substrate to be warped.

Means for Solving the Problems

A method of producing a silicon carbide semiconductor device according to the present invention comprises: step (A) of forming an impurity-doped region by implanting impurity ions into at least a portion of a silicon carbide layer formed on a first principal face of a silicon carbide substrate having first and second principal faces; step (B) of forming capping layers on at least an upper face of the silicon carbide layer and on at least the second principal face of the silicon carbide substrate; and step (C) of performing an activation annealing treatment by heating the silicon carbide layer at a predetermined temperature.

In a preferred embodiment, the silicon carbide substrate is a silicon carbide wafer having a diameter of at least 50 mm or more.

In a preferred embodiment, the capping layers at least contains carbon.

In a preferred embodiment, the capping layers are composed of a diamond-like carbon film, an amorphous carbon film, or an organic film.

In a preferred embodiment, in step (B), the capping layers are formed around the entire silicon carbide substrate having the silicon carbide layer formed thereon.

In a preferred embodiment, the predetermined temperature is higher than 1700° C. and equal to or less than a marginal temperature for the capping layers to remain.

In a preferred embodiment, at step (C), a maximum rate of temperature elevation until reaching the predetermined temperature is no less than 200° C./minute and no more than 1000° C./minute.

In a preferred embodiment, at step (A), the impurity ions are implanted a plurality of times with different acceleration energies.

In a preferred embodiment, step (A) comprises a step of forming an implantation mask covering a predetermined region of the upper face of the silicon carbide layer.

In a preferred embodiment, step (A) comprises steps of implanting respectively different impurity ions by using different implantation masks.

Effects of the Invention

According to the present invention, warping of a silicon carbide substrate can be prevented by forming capping layers on an upper face of the silicon carbide layer and a second principal face of the silicon carbide substrate during an activation annealing. Moreover, since the annealing temperature can be made high, crystal defects occurring due to implantation can be sufficiently recovered, whereby the activation rate can be enhanced. Moreover, rear-face resistance components can be suppressed and an annealing apparatus can be allowed to stably operate. This makes it possible to produce a semiconductor device which includes a semiconductor region having a high impurity concentration and a high carrier mobility.

BRIEF DESCRIPTION OF DRAWINGS

[FIG. 1](*a*) to (*e*) are step-by-step cross-sectional views for describing an embodiment of a method of producing a semiconductor device according to the present invention.

[FIG. 5](*a*) and (*b*) are diagrams for describing the polarity of curvature of an SiC substrate.

[FIG. 6](*a*) to (*d*) are step-by-step cross-sectional views for describing a method of producing a silicon carbide semiconductor device according to a conventional technique.

| DESCRIPTION OF THE REFERENCE NUMERALS | |
|---|---|
| 1 | silicon carbide substrate |
| 2 | silicon carbide layer |
| 2a | upper face |
| 2b | side face |
| 3 | impurity ions |
| 4 | impurity ion-implanted region |
| 6 | capping layer |
| 7 | impurity-doped region |
| 10 | implantation epitaxial substrate |
| 11a | first principal face |
| 11b, 12b | beveled face |
| 12a | second principal face |
| 13 | side face |
| 40 | SiC substrate |
| 41 | silicon carbide layer |
| 42 | implantation mask |
| 43 | impurity ion-implanted region |
| 44 | impurity ions |
| 45 | capping layer |
| 46 | p-well region |
| 47 | n-drift region |
| 300 | semiconductor device |
| 301 | silicon carbide substrate |
| 302 | drift layer |
| 305 | well region |
| 307 | accumulation channel layer |
| 308 | source region |
| 309 | contact region |
| 311 | gate insulating film |
| 312 | source electrode |
| 313 | gate electrode |
| 314 | drain electrode |
| 315 | carbon excessive layer |

BEST MODE FOR CARRYING OUT THE INVENTION

The inventors have conducted a detailed study concerning the cause of a warp of a silicon carbide substrate after a conventional activation annealing treatment. As a result, it was found that the cause of a warp of a silicon carbide substrate concerns the annealing temperature during the activation annealing treatment. As used herein, annealing temperature refers to a maximum temperature reached during an annealing treatment.

Figure 4:
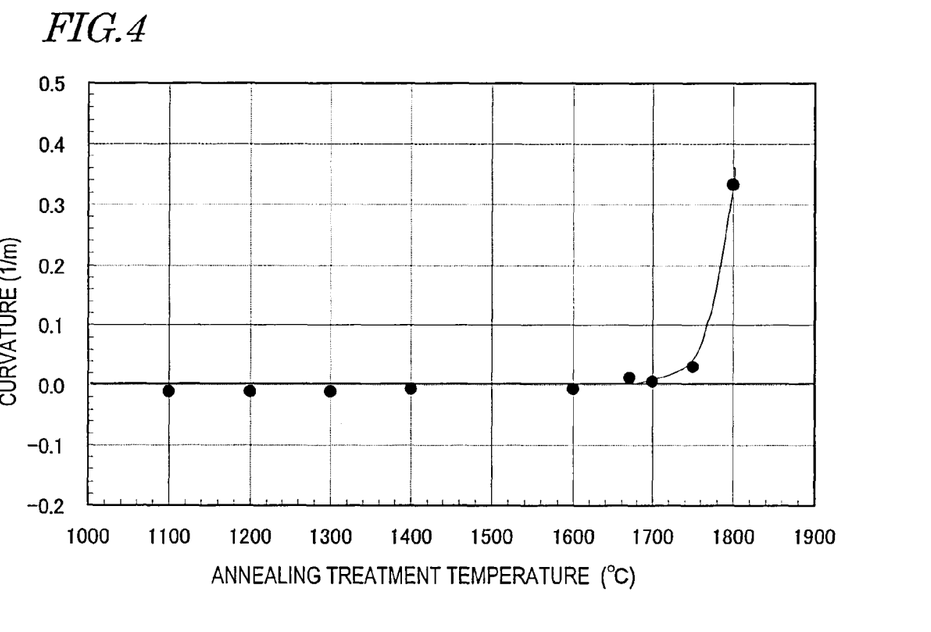
[FIG. 4] A graph showing a relationship between curvature of an SiC substrate after activation annealing and annealing temperature according to a conventional technique.

Specifically, by using 4H—SiC substrates in wafer form with a diameter of 75 mm (3 inches), an impurity implantation was performed, a carbon capping layer was formed only on the front face, and after annealing the substrates at various annealing temperatures, the capping layer was removed and substrate warp was examined. An average rate of temperature elevation was about 400° C./minute. FIG. 4 shows a relationship between annealing temperature and the level of substrate warp. The curvature shown on the vertical axis of FIG. 4 represents a convex warp as shown in FIG. 5(a) on the minus side, and a concave warp as shown in FIG. 5(b) on the plus side.

As shown in FIG. 4, the curvature is 0.01 (1/m) or less when the annealing temperature is 1700° C. or less. However, the curvature is 0.04 (1/m) at 1750° C., and the curvature is 0.3 (1/m) at 1800° C. Thus, when the annealing temperature is higher than 1700° C., warp of the silicon carbide substrate becomes significant. According to a study of the inventors, it was found that the warp of a silicon carbide substrate becomes significant when the annealing temperature is higher than 1700° C., using a wafer with a diameter of 50 mm or more or a rectangular substrate with a longer-side length of 50 mm or more. Since the silicon carbide substrate is warped even after the capping layer is removed, it can be seen that this warp of the silicon carbide substrate is not caused by a difference in coefficient of thermal expansion between the capping layer and the silicon carbide substrate.

When the substrate is thus warped, it becomes impossible to allow the substrate to be sucked onto a substrate holder of an apparatus such as a stepper or a resist coater in a photolithography step, for example. Therefore, in effect, subsequent semiconductor fabrication processes cannot be performed for the silicon carbide substrate, thus making device fabrication impossible.

In order to avoid substrate warp, it might be possible to set the annealing temperature to 1700° C. or less in the case of performing an activation annealing treatment for a silicon carbide substrate of the aforementioned size. However, activation of an ion implantation species greatly depends on the annealing temperature, and the activation rate will improve as the annealing temperature becomes higher. This is because, when the annealing temperature is low, recovery of defects occurring during implantation is insufficient, and since defects remain with a high density, the implanted element does not enter the optimum sites of the SiC crystal (Si sites in the case of Al) but becomes an interstitial element, thus failing to function as a carrier. Therefore, by lowering the temperature of activation annealing, activation of implanted species will become insufficient, thus making it difficult to obtain a silicon carbide semiconductor device having electrical characteristics as are expected from the excellent physical parameters which pertain to silicon carbide.

Moreover, it was found through a detailed experiment that, even when the reached temperature is 1700° C. or more, if the rate of temperature elevation is relatively slow, specifically, if the rate of temperature elevation is slower than about 200° C./minute, a partial regrowth of a polytype of crystal which is different from the original crystal system will occur upon recovery of the crystal defects occurring due to implantation, thus altering the semiconductor characteristics. For example, 4H—SiC may change to 3C—SiC.

Through studies based on various experiments, the inventors have found that it is possible to solve such problems by forming capping layers on both faces of the silicon carbide substrate before performing an activation annealing treatment, thus producing a semiconductor device having flat and excellent characteristics, without allowing substrate warp to occur.

Figure 1:
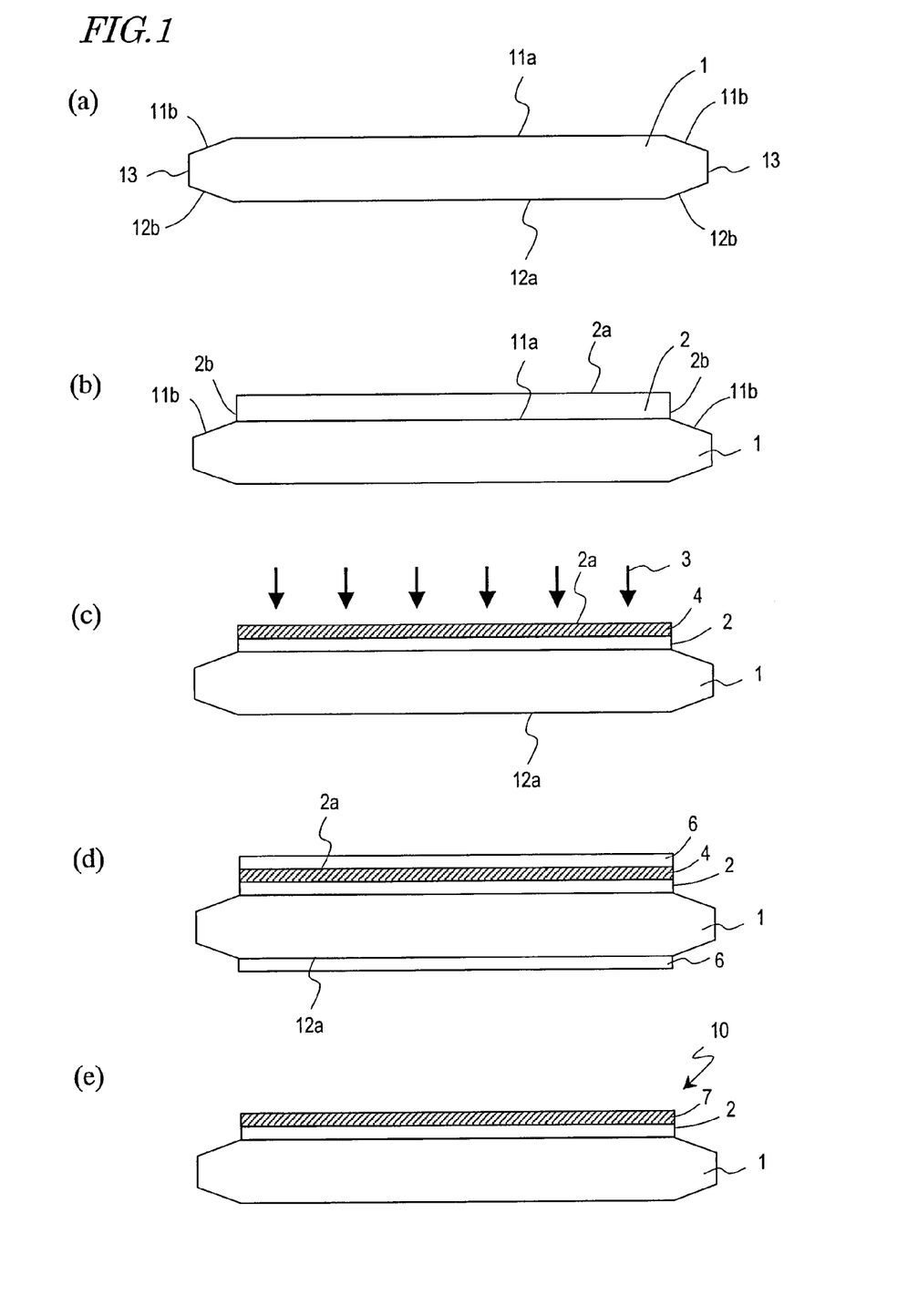

Hereinafter, a method of producing the silicon carbide semiconductor device according to the present invention will be specifically described. First, as shown in FIG. 1(a), a silicon carbide substrate 1 is provided. As the silicon carbide substrate 1, a wafer with a diameter of 50 mm or more or a rectangular substrate with a longer-side length of 50 mm or more is used. The silicon carbide substrate 1 has a first principal face 11a and a second principal face 12a as well as side faces 13. On the silicon carbide substrate 1, beveled faces 11b and beveled faces 12b may be formed at the outer periphery of the first principal face 11a and the outer periphery of the second principal face 12a, respectively, so that the corners where the first principal face 11a and the side faces meet and the corners where the second principal face 12a and the side faces 13 meet will not be chipped due to handling during the semiconductor fabrication processes. In the present embodiment, a silicon carbide substrate (4H—SiC substrate) with a diameter of 75 mm, having an OFF angle of 8 degrees in the [11-20] (112bar0) direction, is used. Moreover, in the present embodiment, the first principal face 11a is an Si plane and the second principal face 12a is a C plane. However, the first principal face 11a and the second principal face 12a may be a C plane and an Si plane.

Next, as shown in FIG. 1(b), a silicon carbide layer 2 having a thickness of e.g. 10 μm is epitaxially grown on the first principal face 11a of the silicon carbide substrate 1 by CVD technique. The silicon carbide layer 2 may be formed not only on the first principal face 11a but also on the beveled faces 11b. Thereafter, as shown in FIG. 1(c), impurity ions 3 are implanted into the silicon carbide layer 2 by using an ion implantation apparatus, thereby forming an impurity ion-implanted region (thickness: e.g. 400 nm) 4 in the silicon carbide layer 2. In the present embodiment, aluminum ions are selected as the impurity ions 3 in order to form a p-type impurity-doped region.

The implantation of impurity ions may be performed a plurality of times with different acceleration energies. Moreover, by implanting impurity ions after forming an implantation mask covering a predetermined region of the upper face 2a of the silicon carbide layer 2, impurity ions may be selectively implanted into the predetermined region of the silicon carbide layer 2. In doing so, a plurality of different implantation masks may be used to implant respectively different impurity ions.

Next, as shown in FIG. 1(d), capping layers 6 are formed so as to cover at least the upper face 2a of the silicon carbide layer 2 and the second principal face 12a of the silicon carbide substrate 1. The beveled faces 11b and 12b may also be covered by the capping layers 6. It is preferable that the capping layers 6 have a higher thermal conductivity than that of silicon carbide and are of a nature such that they do not react with silicon carbide at a high temperature. Moreover, it is preferable that it does not easily decompose or evaporate due to heat, even at the annealing temperature of a subsequently-performed activation annealing treatment. It is also preferable that it is a substance that is easy to be removed after the activation annealing treatment. Since the activation annealing treatment is performed at a temperature higher than 1700° C., it is preferable that the capping layers 6 exhibit such nature at a temperature which is higher than 1700° C.

One substance which is suitable for capping layers 6 having such features is a substance that mainly contains carbon. Carbon has a high thermal conductivity and a high melting point, and is also a constituent element of a silicon carbide substrate, and therefore has a low reactivity with silicon carbide. Moreover, carbon can be relatively easily removed by being subjected to an oxygen plasma or the like. For example, capping layers 6 composed of a crystalline carbon such as amorphous carbon diamond-like carbon (DLC), or organic films such as a resist having thermal resistance can be used. There is no limitation as to the method of forming the capping layers 6. A sputtering technique, a CVD technique, and the like that are used in semiconductor fabrication techniques can be used.

Preferably, the capping layers 6 have a sufficient thickness for suppressing evaporation of silicon from the upper face 2a of the silicon carbide layer 2 and the second principal face 12a of the silicon carbide substrate 1 during the activation annealing treatment. The thickness of the capping layers 6 which is necessary for this purpose will depend on the substance composing the capping layers 6 and the method for forming the same, the time and temperature of the activation annealing treatment, and the like.

The capping layers 6 covering the upper face 2a of the silicon carbide layer 2 and the capping layer 6 covering the second principal face 12a of the silicon carbide substrate 1 may have different thicknesses. The reason is that, as mentioned earlier, it is not a stress of the capping layers 6 themselves that is causing a warp of the silicon carbide substrate 1. However, in the case where the capping layer 6 covering the upper face 2a of the silicon carbide layer 2 and the capping layer 6 covering the second principal face 12a of the silicon carbide substrate 1 have greatly different thicknesses, there is a possibility for the silicon carbide substrate 1 to be warped after the capping layers 6 are formed. In this case, since the silicon carbide substrate 1 is warped, during the activation annealing treatment, it may become difficult to achieve a uniform heating of the silicon carbide substrate 1 in an apparatus for performing a heat treatment. Therefore, the capping layer 6 covering the upper face 2a of the silicon carbide layer 2 and the capping layer 6 covering the second principal face 12a of the silicon carbide substrate 1 preferably have an equal thickness. Even when they are different, it is preferable that they are not so different that the difference in thickness between the capping layer 6 covering the upper face 2a of the silicon carbide layer 2 and the capping layer 6 covering the second principal face 12a of the silicon carbide substrate 1 causes a warp of the silicon carbide substrate 1.

The substance composing the capping layers 6 and the formation method and film thickness thereof are to be determined in consideration of cost and productivity, in addition to the aforementioned conditions concerning the temperature of the activation annealing treatment.

In the present embodiment, amorphous carbon films having a thickness of 150 nm are formed as the capping layers 6 by sputtering technique, on the upper face 2a of the silicon carbide layer 2 and the second principal face 12a of the silicon carbide substrate 1. This thickness is a value which is appropriate in the case where the activation annealing treatment is performed at 1800° C. In the case where the activation annealing treatment is performed at 1850° C., it is preferable that the capping layers 6 have a thickness of about 1 μm because sublimation of the amorphous carbon film will occur.

Next, as shown in FIG. 1(d), the silicon carbide layer 2 is heated, the impurity ions in the impurity-implanted region 4 of the silicon carbide layer 2 are activated, and an impurity-doped region 7 is formed in the silicon carbide layer 2. In order to ensure adequate recovery of crystal defects occurring due to implantation and impurity activation, it is preferable that the annealing temperature is a temperature higher than 1700° C. More preferably, the annealing temperature is 1800° C. or more. In the present embodiment, for example, the silicon carbide substrate 1 is introduced in a heating furnace, and heating is performed so that the silicon carbide substrate 1 has a temperature of 1800° C.

It is preferable that the annealing temperature is as high as possible. The reason is that, as the annealing temperature becomes higher, the activation rate of the implanted impurity ions is improved. However, when the annealing temperature becomes high, the capping layers 6 may be decompose or sublimate, thus losing their function of protecting the surface of the silicon carbide layer 2 and the silicon carbide substrate 1. Therefore, it is preferable that the annealing temperature is set to equal to or less than a marginal temperature for the capping layers 6 to remain during the activation annealing treatment.

Preferably, the maximum rate of temperature elevation is no less than 200° C./minute and no more than 1000° C./minute. If the rate of temperature elevation is smaller than about 200° C./minute, upon recrystallization of the crystal which has been destroyed through implantation of the impurity ions, there will be many regions that become polytype crystals which are different from the original one. Especially in the case where the silicon carbide group 4H—SiC is used, if the rate of temperature elevation is slow, there is a possibility that many regions will become 3C—SiC crystals due to recrystallization. On the other hand, if the rate of temperature elevation is faster than about 1000° C./minute, there is a possibility that the substrate may be cracked due to a thermal shock to the substrate.

Figure 3:
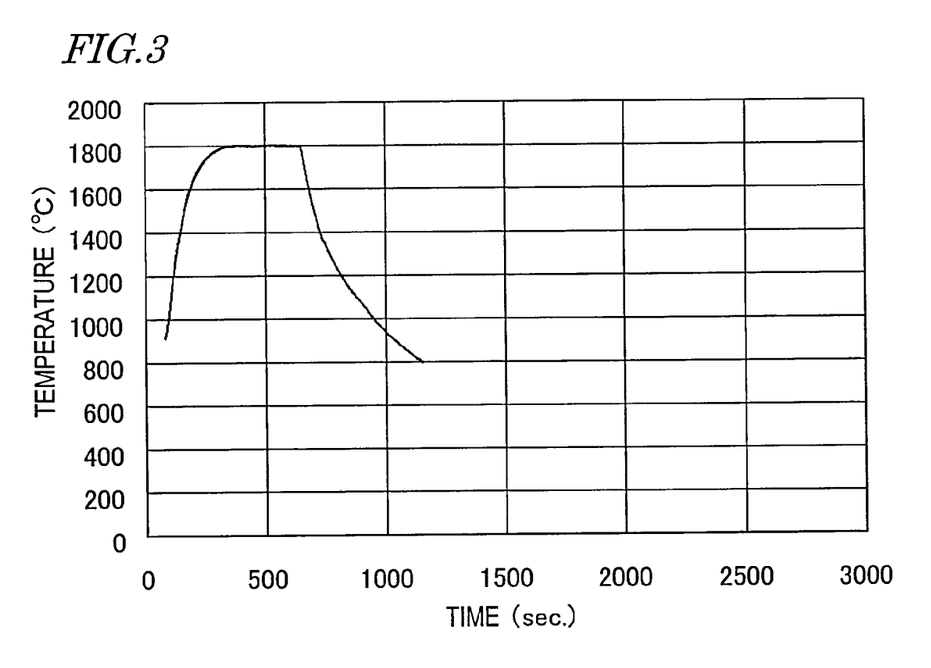
[FIG. 3] A diagram showing a temperature profile in an activation annealing treatment.

In the present embodiment, the maximum rate of temperature elevation is about 400° C./minute, and 1800° C. is maintained for 5 minutes. FIG. 3 shows a temperature profile of the activation annealing treatment. In the temperature profile shown in FIG. 3, in order to prevent overshooting, the rate of temperature elevation is reduced as it approaches 1800° C. However, heating at the maximum rate of temperature elevation may be performed for a longer time to permit overshooting.

At the activation annealing treatment, the capping layers 6 serve as protective films, and restrain step bunching from occurring on the upper face 2a of the silicon carbide layer 2 and the second principal face 12a of the silicon carbide substrate 1. Moreover, even when subjected to a high temperature due to the activation annealing treatment, the capping layers 6 restrain silicon from sublimating from the upper face 2a of the silicon carbide layer 2 and the second principal face 12a of the silicon carbide substrate 1. Therefore, the upper face 2a of the silicon carbide layer 2 and the second principal face 12a of the silicon carbide substrate 1 will both maintain the composition ratio of silicon carbide. This prevents the problem of a carbon excessive layer with a high resistance being formed on the second principal face 12a side of the silicon carbide substrate 1.

After the activation annealing treatment, warping of the silicon carbide substrate 1 does not occur, and the silicon carbide substrate 1 maintains a substantially flat state. This is considered to be because step bunching is suppressed on the upper face 2a to become a front face of the silicon carbide substrate 1 (on which the silicon carbide layer 2 is formed) and also the second principal face 12a to become a rear face, so that their surface states are substantially the same.

Conversely, when an activation annealing treatment is performed by a conventional method, step bunching occurs only on the rear face of the silicon carbide substrate, so that a difference in surface state occurs with respect to the front face on which step bunching is not occurring. Presumably, this causes a stress on the silicon carbide substrate, thereby warping the silicon carbide substrate.

As shown in FIG. 1(e), after the activation annealing treatment, the capping layers 6 are removed from the upper face 2a of the silicon carbide layer 2 and the second principal face 12a of the silicon carbide substrate 1. Although there are no particular limitations as to the method of removing the capping layers 6, in the case where the capping layers 6 are carbon films, they are preferably remove by oxygen plasma ashing. In this manner, a silicon carbide substrate (hereinafter referred to as an "implantation epitaxial substrate") 10 which includes the silicon carbide layer 2 having the impurity-doped region 7 formed on its surface is obtained.

After the capping layers 6 are removed in the aforementioned manner, the resultant implantation epitaxial substrate 10 is subjected to known semiconductor fabrication processes, whereby various silicon carbide semiconductor devices such as an MOSFET, an MESFET, a Schottky diode, or the like can be obtained. Even after the capping layers 6 are removed, the implantation epitaxial substrate 10 is not warped. Therefore, by using semiconductor fabrication apparatuses, a silicon carbide semiconductor device can be fabricated without allowing suction errors or the like to occur.

In a silicon carbide semiconductor device which is obtained in this manner, even in a wafer state before being separated into individual devices, or in the state of having been separated into individual devices, warping of the implantation epitaxial substrate 10 is suppressed, so that the implantation epitaxial substrate 10 is flat. Suppression of warping by the method of the present invention can be verified by measuring the warp of the implantation epitaxial substrate 10 in a wafer state by using a stress checker, for example. Warping of the implantation epitaxial substrate 10 which has been separated into chips can be measured by a laser interference apparatus (e.g. FT-17 from NIDEK CO., LTD.) that measures interference fringes occurring responsive to laser light irradiation, for example. Alternatively, it can be verified based on the absence of step bunching on the second principal face 12a of the epitaxial substrate 10. In either case, when the method according to the present invention is used, a warp of the implantation epitaxial substrate 10 will be 0.01 (1/m) or less, as evaluated in a curvature value.

Thus, according to the present invention, by forming capping layers on an upper face of a silicon carbide layer and a second principal face of the silicon carbide substrate, the silicon carbide substrate is prevented from warping during an activation annealing.

Moreover, during the activation annealing treatment, step bunching is restrained from occurring on the upper face 2a of the silicon carbide layer 2. Therefore, by forming an oxide film on the silicon carbide layer 2 and electrodes further thereupon, a silicon carbide semiconductor device of an MIS structure which has a good oxide film-semiconductor interface and a high gate breakdown voltage and which exhibits good current-voltage characteristics is realized.

Moreover, since the activation rate of the implanted impurity ions is high, an impurity-doped region with a high concentration can be obtained. Therefore, by forming an ohmic electrode which is in contact with the surface of the silicon carbide layer 2 (or the impurity-doped region 7), a silicon carbide semiconductor device having a low-resistance ohmic contact and good current-voltage characteristics is realized.

The warp of the implantation epitaxial substrate 10 having been produced in this manner and the activation rate of the ion implantation species were measured. Measurement of the warp of the implantation epitaxial substrate 10 was taken by using a stress checker, and evaluated in a curvature value. The activation rate of the implanted species was calculated from a ratio between a carrier concentration by Hall measurement and a dopant concentration according to a Secondary Ion Mass Spectrometry apparatus (SIMS).

For comparison, an implantation epitaxial substrate of Comparative Example was produced under the same conditions, except that a capping layer was not formed on the second principal face of the silicon carbide substrate. The activation annealing in Comparative Example was performed for 5 minutes in an argon gas atmosphere by setting the substrate temperature at 1800° C. For the implantation epitaxial substrate of Comparative Example, too, the substrate warp was measured in a manner similar to the implantation epitaxial substrate 10. The results are shown in Table 1 below.

TABLE 1

|  | curvature of substrate |
| --- | --- |
| Embodiment | 0.006 (1/m) |
| Comparative Example | 0.3 (1/m) |

As shown in Table 1, the implantation epitaxial substrate 10 of the present embodiment has a curvature of 0.006 (1/m), indicative of a very small warp. On the other hand, the implantation epitaxial substrate of Comparative Example has a curvature of 0.3 (1/m), which is two or more digits larger than that of the present embodiment. When the implantation epitaxial substrates of the present embodiment and Comparative Example were set in actual semiconductor fabrication apparatuses, the implantation epitaxial substrate of the present embodiment experienced no suction errors in any process apparatuses, including a stepper. On the other hand, the implantation epitaxial substrate of Comparative Example experienced a suction error with respect to the substrate holder of the stepper, thus making it impossible to perform a photolithography process.

Moreover, the aluminum ions in the implantation epitaxial substrate of the present embodiment had an activation rate of about 90%, whereby it was confirmed that a very high activation was realized.

As is clear from these results, according to the present embodiment, warping of a silicon carbide substrate can be prevented by forming capping layers on an upper face of the silicon carbide layer and a second principal face of the silicon carbide substrate during an activation annealing. Moreover, since the annealing temperature can be made high, crystal defects occurring due to implantation can be sufficiently recovered, whereby the activation rate can be enhanced. This makes it possible to produce a semiconductor device which includes a semiconductor region having a high impurity concentration and a high carrier mobility.

Moreover, during the activation annealing treatment, sublimation of silicon from the silicon carbide layer 2 and the silicon carbide substrate 1 can be substantially completely suppressed because the silicon carbide layer 2 and the silicon carbide substrate 1 are substantially completely covered by the capping layers. Therefore, the inside of a heat treatment furnace which is used for the activation annealing treatment can be prevented from being contaminated with sublimated silicon, and likely changes in the heat treatment condition caused by adhesion of sublimated silicon to the inside of the heat treatment furnace can be suppressed.

Figure 2:
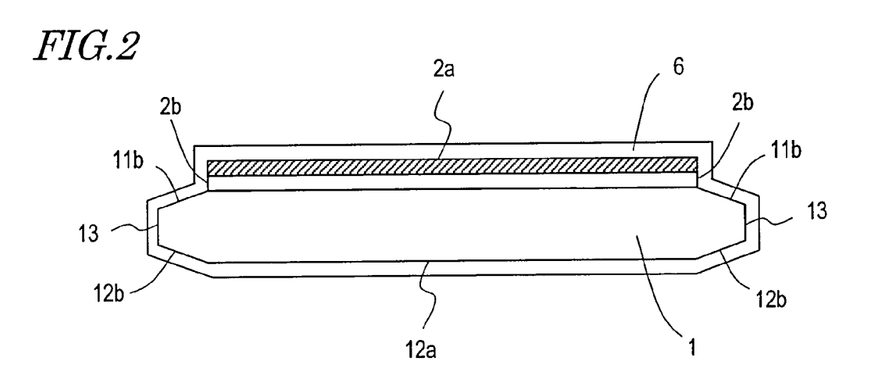
[FIG. 2] A diagram showing another form of a capping layer 6 in the step shown in FIG. 1(*d*).

In the present embodiment, as shown in FIG. 1(d), the capping layers 6 are formed only on the upper face 2a of the silicon carbide layer 2 and the second principal face 12a of the silicon carbide substrate 1. Therefore, side faces 2b of the silicon carbide layer 2, the beveled faces 11b and 12b of the silicon carbide substrate 1, and the side faces 13 of the silicon carbide substrate 1 (FIG. 1(a), (b)) are exposed, leading to a possibility that silicon may sublimate from these exposed faces during the activation annealing treatment. In the case where it is a problem that silicon sublimation from these faces causes a decrease in the thicknesses or diameters of the silicon carbide substrate 1 and the silicon carbide layer 2 at the ends of the silicon carbide layer 2 and the ends of the silicon carbide substrate 1, the entire silicon carbide substrate 1 with the silicon carbide layer 2 formed thereon may be covered by capping layers 6 so that there are no exposed portions, as shown in FIG. 2, and an activation annealing treatment may be performed.

Specifically, before an activation annealing treatment, not only the upper face 2a of the silicon carbide layer 2 and the second principal face 12a of the silicon carbide substrate 1, but also the side faces 2b of the silicon carbide layer 2 and the beveled faces 11b and 12b and the side faces 13 of the silicon carbide substrate 1 are covered with capping layers 6. In order to cover the side faces 2b of the silicon carbide layer 2 and the side faces 13 of the silicon carbide substrate 1 with capping layers 6 having a sufficient thickness, it is preferable to form the capping layers 6 by a thin film formation method which provides excellent step coverage, e.g., CVD technique. This eliminates exposed portions of the silicon carbide substrate 1 and the silicon carbide layer 2, so that, with greater certainty, the silicon can be prevented from sublimating from the silicon carbide substrate 1 and the silicon carbide layer 2 during the activation annealing treatment.

Although a capping layer is formed first on the upper face 2a of the silicon carbide layer 2 in the present embodiment, a capping layer may be formed first on the second principal face 12a of the silicon carbide substrate 1. The crystal system of the silicon carbide substrate 1 is not limited to 4H—SiC, but a substrate composed of a polytype other than 4H—SiC may also be used.

INDUSTRIAL APPLICABILITY

The present invention is broadly applicable to various silicon carbide semiconductor devices including MOSFETs, MESFETs, Schottky diodes, and the like. A silicon carbide semiconductor device according to the present invention can be used for a low-loss power device which is usable in various kinds of power/electrical equipment such as electric home appliances, automobiles, electric power transmission/conversion devices, and industrial equipment.

The invention claimed is:

1. A method of producing a silicon carbide semiconductor device, comprising:
    step (A) of forming an impurity-doped region by implanting impurity ions into at least a portion of a silicon carbide layer formed on a first principal face of a silicon carbide substrate having first and second principal faces;
    step (B) of forming capping layers on at least an upper face of the silicon carbide layer and on at least the second principal face of the silicon carbide substrate; and
    step (C) of performing an activation annealing treatment by heating the silicon carbide layer at a predetermined temperature.

2. The method of producing a silicon carbide semiconductor device of claim 1, wherein the silicon carbide substrate is a silicon carbide wafer having a diameter of at least 50 mm or more.

3. The method of producing a silicon carbide semiconductor device of claim 1, wherein the capping layers at least contains carbon.

4. The method of producing a silicon carbide semiconductor device claim 3, wherein the capping layers are composed of a diamond-like carbon film, an amorphous carbon film, or an organic film.

5. The method of producing a silicon carbide semiconductor device of claim 1, wherein, in step (B), the capping layers are formed around the entire silicon carbide substrate having the silicon carbide layer formed thereon.

6. The method of producing a silicon carbide semiconductor device of claim 1, wherein the predetermined temperature is higher than 1700° C. and equal to or less than a marginal temperature for the capping layers to remain.

7. The method of producing a silicon carbide semiconductor device of claim 1, wherein, at step (C), a maximum rate of temperature elevation until reaching the predetermined temperature is no less than 200° C./minute no more than 1000° C./minute.

8. The method of producing a silicon carbide semiconductor device of claim 1, wherein, at step (A), the impurity ions are implanted a plurality of times with different acceleration energies.

9. The method of producing a silicon carbide semiconductor device of claim 1, wherein step (A) comprises a step of forming an implantation mask covering a predetermined region of the upper face of the silicon carbide layer.

10. The method of producing a silicon carbide semiconductor device of claim 9, wherein step (A) comprises steps of implanting respectively different impurity ions by using different implantation masks.

* * * * *

UNITED STATES PATENT AND TRADEMARK OFFICE
CERTIFICATE OF CORRECTION

PATENT NO. : 7,718,519 B2
APPLICATION NO. : 12/302372
DATED : May 18, 2010
INVENTOR(S) : Kunimasa Takahashi et al.

Figure 5:
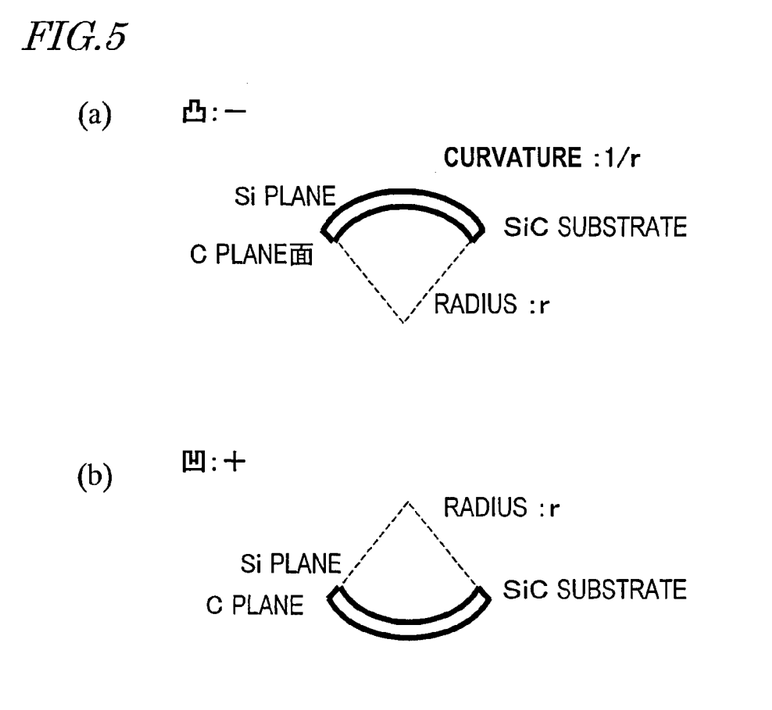

It is certified that error appears in the above-identified patent and that said Letters Patent is hereby corrected as shown below:

In Drawings Fig. 5, Japanese characters should be deleted.

Col. 12 Line 20 Claim 3, as allowed, "contains" should read -- contain --;
Col. 12 Line 22 Claim 4, as allowed, "device claim 3" should read -- device of claim 3 --; and
Col. 12 Line 36 Claim 7, as allowed, "no more" should read -- and no more --.

Signed and Sealed this

Ninth Day of November, 2010

David J. Kappos
*Director of the United States Patent and Trademark Office*